United States Patent [19]

Mathews

[11] Patent Number: 5,895,268
[45] Date of Patent: Apr. 20, 1999

[54] HIGH PRESSURE NITRIDATION OF TUNGSTEN

[75] Inventor: Viju K. Mathews, Boise, Id.

[73] Assignee: Micron Technology, Inc.

[21] Appl. No.: 08/617,208

[22] Filed: Mar. 18, 1996

[51] Int. Cl.⁶ .................................. H01L 21/44
[52] U.S. Cl. ............... 438/672; 438/637; 438/675; 438/685; 438/688
[58] Field of Search ................... 437/190, 192; 438/643, 644, 653, 659, 660, 637, 672, 675, 685, 688

[56] References Cited

U.S. PATENT DOCUMENTS

| | | | |
|---|---|---|---|
| 4,960,732 | 10/1990 | Dixit et al. | 437/192 |
| 5,318,924 | 6/1994 | Lin et al. | 437/192 |
| 5,382,817 | 1/1995 | Kashihara et al. | 257/295 |
| 5,633,200 | 5/1997 | Hu | 438/653 |

Primary Examiner—Charles Bowers
Assistant Examiner—Reneé R. Berry
Attorney, Agent, or Firm—Workman, Nydegger & Seeley

[57] ABSTRACT

Disclosed is a method for forming a refractory metal nitride layer which is highly suitable for diffusion barrier formation in CMOS structures. The process comprises first, forming a refractory metal layer and patterning therefrom a tungsten plug. The tungsten plug is then placed in a furnace where it is heated in an environment containing nitrogen at a high pressure. The high pressure allows efficient tungsten nitride formation at a low temperature so as to form tungsten nitride. In one embodiment, the furnace environment comprises ammonia, the pressure is about 25 atmospheres, and the temperature is about 500° C. The tungsten nitride is a diffusion barrier that is formed between a tungsten plug and a superadjacent aluminum interconnect line that is deposited thereover in a CMOS memory structure.

28 Claims, 1 Drawing Sheet

HIGH PRESSURE NITRIDATION OF TUNGSTEN

BACKGROUND OF THE INVENTION

1. The Field of the Invention

The present invention relates to the formation of refractory metal nitrides. More particularly, the present invention is directed to the formation of refractory metal nitrides in a process suitable for forming diffusion barriers in integrated circuit manufacturing processes.

2. The Relevant Technology

In the manufacturing of integrated circuits, barriers are often needed to prevent the diffusion of one material into another. An example of a structure which requires the use of a diffusion barrier is the CMOS memory structure of FIG. 1. Therein is shown word lines 12 formed over a silicon substrate 10. Active regions 14 underlie word lines 12, and LOCOS spacers 24 separate the illustrated memory structure from other structures formed on silicon substrate 10. Each word line 12 is connected to a corresponding memory cell 16. In order to provide access to memory cells 16, aluminum interconnect line 18 is formed on the surface of the memory structure. Separating memory cells 16 from aluminum interconnect line 18 is a passivation layer 20, which is formed of an insulating material such as borophosphosilicate glass (BPSG). To interconnect memory cells 16 with aluminum interconnect line 18, a tungsten plug 22 may be used which extends down through passivation layer 20 to make electrical contact with one of active regions 14.

The use of tungsten plug 22 is advantageous because it forms a more desirable interface with underlying active regions 14 than does aluminum. Nevertheless, the current technology used to form tungsten plug 22 does present certain drawbacks. One drawback is that the tungsten of tungsten plug 22 and the aluminum of aluminum interconnect line 18 tend to interdiffuse at temperatures of about 450° C. and greater. The resulting alloy ($WAl_2$) forms an interface between the tungsten plug and the aluminum interconnect lines that is highly resistive and hinders the performance of the memory structure or other structures connected thereto. Specifically, the alloy structure degrades the interface properties and increases the resistance of the interface, thereby lowering device speed. Device speed is an important factor in the performance of structures such as CMOS memory circuits, and consequently it is desirable to have a low resistance at the interface.

One attempt in the art to overcome this problem is the use of a titanium nitride (TiN) barrier layer which is formed over the tungsten plug before aluminum interconnect line formation. A memory structure using a titanium nitride diffusion barrier is shown in FIG. 2. Therein can be seen a titanium nitride diffusion barrier 26 located between tungsten plug structure 22 and aluminum interconnect line 18.

Titanium nitride diffusion barrier 26 performs satisfactorily as a diffusion barrier, but the formation of titanium nitride diffusion barrier 26 tends to increase the throughput time of the integrated circuit manufacturing process. In the formation of a titanium nitride diffusion barrier, titanium must first be deposited and then be annealed in an atmosphere of nitrogen. This requires several extra steps, extra equipment and space in a clean room for depositing the titanium, as well as the extra expense of the required titanium.

Experimental use has been made of tungsten nitride structures in order to overcome this problem. The use of tungsten nitride has appeared promising, as it eliminates the need for a titanium deposition step. Three methods of forming tungsten nitride diffusion barriers have been used by prior art. The first method comprises the furnace formation of tungsten nitride. The second method, similar to the first, is the rapid thermal nitridization of tungsten nitride. Both of these methods are unsuitable for applications such as CMOS memory structures, due to the high temperatures required. Diffusion barriers such as titanium nitride diffusion barrier 26 are typically formed at the back end of the memory circuit formation process at a point wherein transistors and other active devices are already formed. High temperatures tend to cause the diffusion of dopant materials from active regions 14 of transistors and other active devices, thereby lowering performance and possibly causing failure of such transistors or other active devices. Thus, the first and second methods known in the art are undesirable.

The third method known in the art for forming tungsten nitride diffusion barriers comprises plasma assisted formation of tungsten nitride, where the necessary energy for tungsten nitride formation is provided by a plasma. Plasma assisted processes are still in their infancy, and tend to be very slow and highly inefficient. Consequently, the third method is also undesirable.

Thus, it is apparent that a need exists in the art for a method for forming a diffusion barrier which overcomes the problems discussed above. It would be highly beneficial if a method could be provided for forming a diffusion barrier of tungsten nitride efficiently and at a low temperature in order to be compatible with current CMOS memory structure processes.

SUMMARY AND OBJECTS OF THE INVENTION

The present invention seeks to resolve the above and other problems which have been experienced in the art. More particularly, the present invention constitutes an advancement in the art by providing a process for forming a diffusion barrier which achieves each of the objects listed below.

It is an object of the present invention to form a satisfactory barrier to the interdiffusion of refractory metals such as tungsten with conductive metals such as aluminum.

It is also an object of the present invention to provide such a diffusion barrier and a process for forming the diffusion barrier which requires few steps and equipment, as well as minimized raw materials.

It is another object of the present invention to provide such a diffusion barrier composed of tungsten nitride which can be efficiently formed at optimally low temperatures.

To achieve the foregoing objects, and in accordance with the invention as embodied and broadly described herein in the preferred embodiment, a method is provided for the efficient formation of refractory metal nitrides. The method of the present invention for forming refractory metal nitrides can be used to efficiently form a diffusion barrier and is especially suitable for the formation of diffusion barriers in CMOS memory structures as the method does not require high temperatures, thus minimizing the out diffusion of dopants from structures such as transistors and other active devices.

The first step of the method of the present invention comprises the formation of a refractory metal layer. In one embodiment, where a CMOS memory structure is being formed, the CMOS memory cells are first formed and a passivation layer such as borophosphosilicate glass (BPSG) is formed above the memory structure. A contact opening is then etched through the passivation layer. The refractory metal layer is then formed by depositing tungsten into the contact opening. In the CMOS memory structure embodiment, this comprises the formation of a tungsten plug in the contact opening.

In a further step of the method of the present invention, a furnace or other chamber is provided within which the refractory metal layer can be heated at a high pressure in an environment containing nitrogen. Preferably, the nitrogen-containing environment is created by flooding the furnace or chamber with a nitrogen source gas such as a gaseous ammonia compound or diatomic nitrogen. The pressure is preferably set at between about 1 and 70 atmospheres and more preferably is set at about 25 atmospheres. The temperature is preferably set below about 500° C., and most preferably is set at about 400° C. The refractory metal layer is then heated to form a refractory metal nitride layer.

The nitrogen source gas is selected to react with the refractory metal to form a refractory metal nitride without detrimental reactions to the process flow. Gaseous ammonia and diatomic nitrogen are suitable examples when the refractory metal comprises tungsten. However, an alternative embodiment is also contemplated, and involves the use of nitrous oxide ($N_2O$), gaseous compounds of ammonia, or other compounds which will react with the refractory metal layer to form a refractory metal nitride as well as a sacrificial layer such as an oxide layer above the refractory metal oxide. This oxide layer or other sacrificial layer is then removed by conventional processes.

In the embodiment of the in-process integrated circuit wafer on which the CMOS memory structure is formed, the wafer is placed in the furnace or heating chamber and a tungsten nitride layer is thereby formed above the tungsten plug. The tungsten nitride layer serves as a diffusion barrier between the tungsten plug and superadjacent layers. Once the tungsten nitride diffusion barrier is formed, a metalization step is performed to provide the surface of the memory structure with metal interconnect lines.

The refractory metal nitride layer of the present invention is preferred for use in forming a diffusion barrier between a refractory metal and a conductive metal. In the CMOS memory structure embodiment, the conductive metal comprises aluminum, in the form of aluminum interconnect lines.

The diffusion barrier thus formed will prohibit the inter-diffusion of the tungsten and aluminum even at temperature of greater than about 450° C. Furthermore, as the method of the present invention is conducted at low temperatures, it can be conducted at the back end of CMOS memory structure formation. Furthermore, the inventive process for the formation of tungsten nitride requires fewer steps and less equipment than the formation of conventional diffusion barriers discussed above.

BRIEF DESCRIPTION OF THE DRAWINGS

In order that the manner in which the above-recited and other advantages and objects of the invention are obtained will be understood, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Provided herein is a method for forming a refractory metal nitride layer efficiently and at low temperatures. The method of the present invention is highly suitable for forming a tungsten nitride diffusion barrier between tungsten and aluminum layers and can be formed without the need for the additional materials or extra steps required in forming the diffusion barriers of the prior art.

Figure 1:
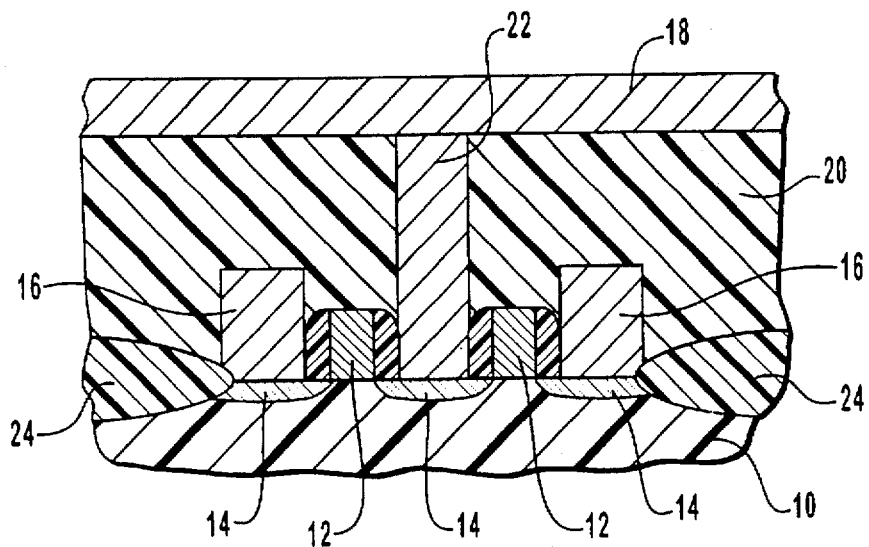
FIG. 1 is a schematic representation of a CMOS memory structure utilizing a tungsten plug and aluminum interconnect lines.
Figure 2:
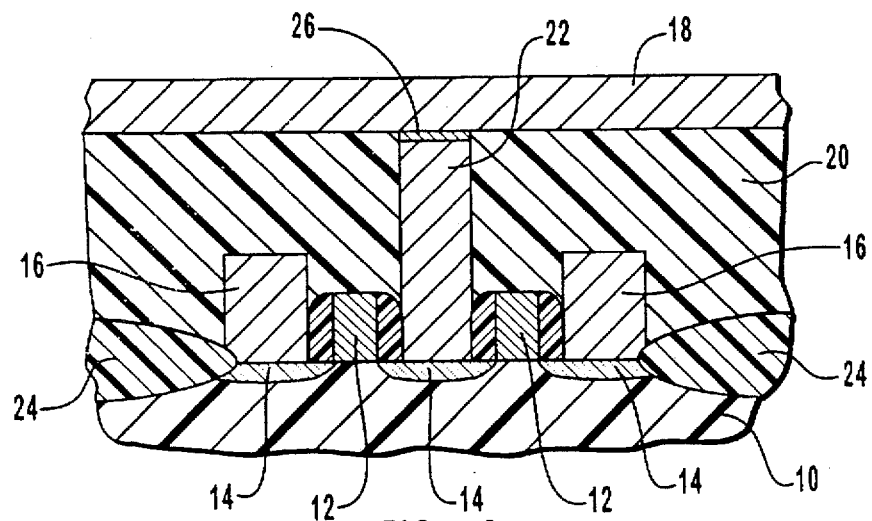
FIG. 2 is a schematic representation of the memory structure of FIG. 1, incorporating a titanium nitride barrier layer between the tungsten plug and the aluminum interconnect lines in accordance with the method of the prior art.
Figure 3:
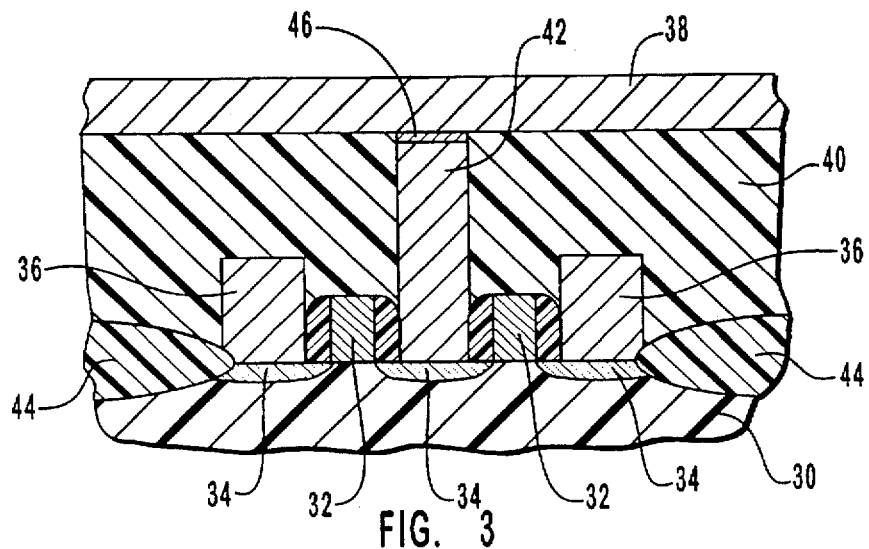
FIG. 3 is a schematic representation of the memory structure of FIG. 1, incorporating a tungsten nitride barrier layer between the tungsten plug and the aluminum interconnect lines in accordance with the method of the present invention.

The method of the present invention will be illustrated in an embodiment comprising the formation of the CMOS memory structure represented graphically in FIG. 3. The first step of the method of the present invention comprises forming a layer of refractory metal on the substrate of a wafer. When forming a tungsten plug and aluminum interconnect lines of a CMOS memory structure, as in the embodiment depicted in FIG. 3, memory cells 36 are first formed in accordance with known processes of the prior art. Memory cells 36 in this embodiment, comprise stacked capacitors. Memory cells 36 are formed above doped active regions 34 on a silicon substrate 30 and are covered with a passivation layer such as BPSG layer 40. A word line 32 is then formed, a contact opening is etched through BPSG layer 40, and the refractory metal layer is then deposited. In the embodiment of FIG. 3, the refractory metal layer is formed into a tungsten plug 42 within the contact opening. LOCOS spacers 44 are formed to separate memory cells 36 from other structures on silicon substrate 30.

The next step is to place the wafer in a furnace or heating chamber wherein the refractory metal region can be heated at a high pressure. The furnace or heating chamber must be capable of providing pressures between about 1 and 70 atmospheres at a temperature of about 500° C. The furnace may, for example, comprise a conventional tube furnace.

The furnace or heating chamber is filled with a nitrogen source to form an environment containing nitrogen. The nitrogen source preferably comprises ammonia ($NH_3$) or diatomic nitrogen ($N_2$). Other sources of nitrogen can also be used which form refractory metal nitrides without undesirable reactions. Optionally, a nitrogen source could be used which also forms a sacrificial layer which can then be removed. An example of this is various compounds of ammonia or nitrous oxide ($N_2O$). Nitrous oxide will react with the refractory metal to form both the refractory metal nitride layer and a sacrificial layer of oxide which can be removed with conventional oxide removal techniques.

The refractory metal nitride layer is formed on the wafer in the furnace or heating chamber where it is exposed to the nitrogen-containing environment. The nitrogen-containing environment can be a cluster tool. The furnace is set at a high pressure, typically in the range of between about 1 and 70 atmospheres. Most preferred is a pressure of about 25 atmospheres. The temperature is set at below about 500° C. Preferably, the temperature is set at about 400° C.

Alternatively, the furnace could be one that is suitable for rapid thermal nitridization (RTN) as is known in the art, whereby the temperature is ramped up quickly, maintained for a brief period of time, then ramped back down. In accordance with the present invention, however, the described RTN process could be conducted at higher pressures and lower temperatures than conventional RTN processes.

A refractory metal nitride layer is formed in the high pressure, low temperature the nitrogen-containing environment of the furnace or heating chamber. In the embodiment of FIG. 3, the refractory metal nitride layer comprises a tungsten nitride layer 46. To complete the memory structure of FIG. 3, aluminum interconnect lines 38 are deposited and etched as shown. As the process of the present invention is conducted at lower temperatures, transistors and other previously formed active devices of the memory cells are not harmed in the formation of the refractory metal nitride layer. Also, when the temperature is raised during further processing, such as in an anneal step to cure defects in the tungsten or aluminum, the tungsten and aluminum will not interdiffuse. Thus, a highly conductive, low resistance interface is maintained. The process of the present invention is also efficient, as it eliminates extra steps necessary in the prior art for forming a titanium nitride diffusion barrier.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for forming a diffusion barrier layer comprising:
    forming a refractory metal layer situated over a substrate on a semiconductor wafer; and
    converting a top portion of the refractory metal layer into a refractory metal nitride diffusion barrier layer by exposing the top portion of the refractory metal layer to an environment containing a gaseous nitrogen compound at a pressure of greater than about 1 atmosphere and at a temperature lower than about 500° C.

2. A method as recited in claim 1, wherein the gaseous nitrogen compound comprises ammonia.

3. A method as recited in claim 1, wherein the gaseous nitrogen compound comprises diatomic nitrogen.

4. A method as recited in claim 1, wherein the environment containing a gaseous nitrogen compound has a pressure of between about 1 and 70 atmospheres.

5. A method as recited in claim 1, wherein the environment containing a gaseous nitrogen compound has a pressure of approximately 25 atmospheres.

6. A method as recited in claim 1, wherein the environment containing a gaseous nitrogen compound has a temperature within the range of between about 500° C. and about 200° C.

7. A method as recited in claim 1, wherein the environment containing a gaseous nitrogen compound has a pressure of about 25 atmospheres and a temperature of about 500° C.

8. A method as recited in claim 1, wherein exposing the top portion of the refractory metal layer to an environment containing a gaseous nitrogen compound is conducted in a tube furnace.

9. A method as recited in claim 1, wherein the refractory metal layer reacts with the gaseous nitrogen compound to form a sacrificial layer upon the refractory metal nitride diffusion barrier layer.

10. A method as recited in claim 9, wherein the gaseous nitrogen compound comprises nitrous oxide.

11. A method as recited in claim 9, wherein the gaseous nitrogen compound comprises an oxygen and ammonia containing compound.

12. A method as recited in claim 9, further comprising removing the sacrificial layer subsequent to the conversion of the top portion of the refractory metal layer into the refractory metal nitride diffusion barrier layer.

13. A method as recited in claim 1, wherein the refractory metal comprises tungsten and wherein the refractory metal nitride diffusion barrier layer comprises tungsten nitride.

14. A method as recited in claim 1, further comprising depositing a conductive metal layer upon the refractory metal nitride diffusion barrier layer.

15. A method as recited in claim 14, wherein the conductive metal layer comprises aluminum.

16. A method as recited in claim 1, wherein exposing the refractory metal layer to an environment containing a gaseous nitrogen compound includes a rapid thermal nitridization step conducted in an RTP chamber.

17. A method for forming a diffusion barrier layer comprising:
    forming a refractory metal layer situated over a substrate on a semiconductor wafer;
    converting a top portion of the refractory metal layer into a refractory metal nitride diffusion barrier layer by exposing the top portion of the refractory metal layer to an environment containing a gaseous nitrogen compound at a pressure of greater than about 1 atmosphere and at a temperature lower than about 500° C.; and
    depositing a conductive metal layer upon the refractory metal nitride diffusion barrier layer.

18. A method as recited in claim 17, wherein the gaseous nitrogen compound comprises ammonia.

19. A method as recited in claim 17, wherein the gaseous nitrogen compound comprises diatomic nitrogen.

20. A method as recited in claim 17, wherein the environment containing a gaseous nitrogen compound has a pressure of about 25 atmospheres and a temperature of about 500° C.

21. A method as recited in claim 20, wherein exposing the top portion of the refractory metal layer to an environment containing a gaseous nitrogen compound is conducted in a tube furnace.

22. A method as recited in claim 21, wherein the refractory metal layer is composed of tungsten and wherein the refractory metal nitride diffusion barrier layer is composed of tungsten nitride.

23. A method as recited in claim 22, wherein the conductive metal layer comprises aluminum.

24. A method as recited in claim 23, wherein the refractory metal layer reacts with the gaseous nitrogen compound to form a sacrificial layer upon the refractory metal nitride diffusion barrier layer.

25. A method as recited in claim 24, wherein the gaseous nitrogen compound comprises ammonious oxide.

26. A method as recited in claim 25, further comprising removing the sacrificial layer prior to depositing a conductive metal layer upon the refractory metal nitride diffusion barrier layer.

27. A method as recited in claim 17, wherein exposing the refractory metal layer to an environment containing a gaseous nitrogen compound includes a rapid thermal nitridization step conducted in an RTP chamber.

28. A method for forming a diffusion barrier layer comprising:

forming a tungsten plug within a contact hole in contact with an active region adjacent to a memory cell situated over a substrate;

converting a top portion of the tungsten plug into a tungsten nitride diffusion barrier layer by exposing the top portion of the tungsten plug to an environment containing a gaseous nitrogen compound at a pressure between about 1.5 atmospheres and about 70 atmospheres at a temperature lower than about 500° C.; and depositing an aluminum layer upon the tungsten nitride diffusion barrier layer.

* * * * *

UNITED STATES PATENT AND TRADEMARK OFFICE
CERTIFICATE OF CORRECTION

PATENT NO.   : 5,895,268

DATED        : April 20, 1999

INVENTOR(S)  : Viju K. Mathews

It is certified that error appears in the above-identified patent and that said Letters Patent is hereby corrected as shown below:

Title Page: References Cited, left col. insert the following:
        5,610,106  3/1995  Foster et al.

Signed and Sealed this

Eighteenth Day of January, 2000

Attest:

Q. TODD DICKINSON

*Attesting Officer*      *Commissioner of Patents and Trademarks*